(12) United States Patent
Fraysse

(10) Patent No.: US 7,514,994 B2
(45) Date of Patent: Apr. 7, 2009

(54) AMPLIFIER WITH HIGH OUTPUT POWER DYNAMIC

(75) Inventor: Jean-Philippe Fraysse, Villeneuve Tolosane (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 10/566,397

(22) PCT Filed: Jul. 5, 2004

(86) PCT No.: PCT/FR2004/001748

§ 371 (c)(1),
(2), (4) Date: Apr. 11, 2006

(87) PCT Pub. No.: WO2005/022741

PCT Pub. Date: Mar. 10, 2005

(65) Prior Publication Data

US 2006/0192615 A1    Aug. 31, 2006

(30) Foreign Application Priority Data

Jul. 31, 2003   (FR)  .................................. 03 09421

(51) Int. Cl.
 *H03F 3/68*    (2006.01)
(52) U.S. Cl. .................. 330/124 R; 330/51; 330/124 D
(58) Field of Classification Search ............. 330/124 R, 330/124 D, 51
See application file for complete search history.

(56) References Cited

U.S. PATENT DOCUMENTS

| 4,547,745 | A | 10/1985 | Degenford et al. |
| 5,012,200 | A | 4/1991 | Meinzer |
| 5,410,281 | A | 4/1995 | Blum |
| 5,543,751 | A | 8/1996 | Matz et al. |
| 5,767,755 | A | 6/1998 | Kim et al. |
| 6,252,871 | B1 | 6/2001 | Tran et al. |
| 2002/0097087 | A1* | 7/2002 | Petz et al. ............... 330/124 R |

FOREIGN PATENT DOCUMENTS

| EP | 0 540 286 A | 5/1993 |
| WO | WO 2004/023647 A | 3/2004 |

OTHER PUBLICATIONS

C. Y. Hang et al, "A New Amplifier Power Combining Scheme with Optimum Efficiency Under Variable Outputs", 2002 IEEE MTT-S International Microwave Symposium Digest. (IMS 2002), Seattle, WS, Jun. 207, 2002, IEEE, MTT-S International Microwave Symposium,, New York, NY IEEE< vol. 2 of 4 Jun. 2, 2002, pp. 913-916, XP001109929.

* cited by examiner

*Primary Examiner*—Michael B Shingleton
(74) *Attorney, Agent, or Firm*—Sughrue Mion, PLLC

(57) ABSTRACT

The invention concerns an amplifier comprising a specific number of N active elements (11 to 1N) coupled in parallel to a load impedance (2) via an adaptive device (3) including at least a specific number of N referenced susceptance compensating circuits (41 to 41N)> The susceptance compensating circuits (41 to 41N) are connected respectively to the outputs of the N Active elements (11 to 1N) to compensate the output susceptance of the active elements to a conductance combining and adapting circuit (5) having N inputs connected respectively to the outputs of the N susceptance compensation circuits and an output connected to the load impedance (2) of the amplifier. The invention is applicable to microwave amplifiers with high output power dynamics.

13 Claims, 5 Drawing Sheets

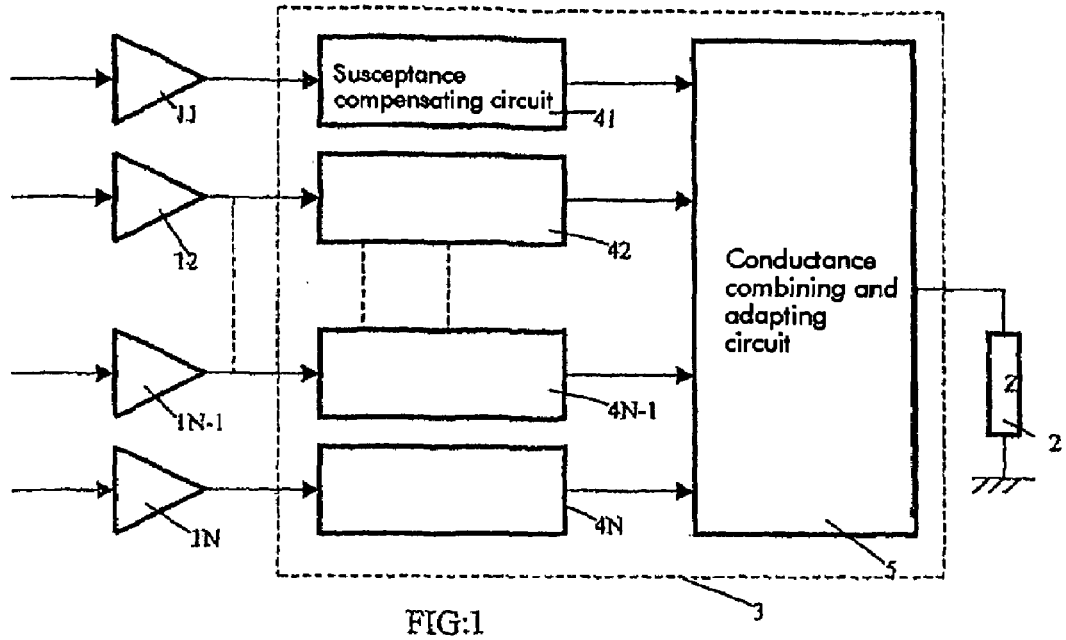
FIG:1
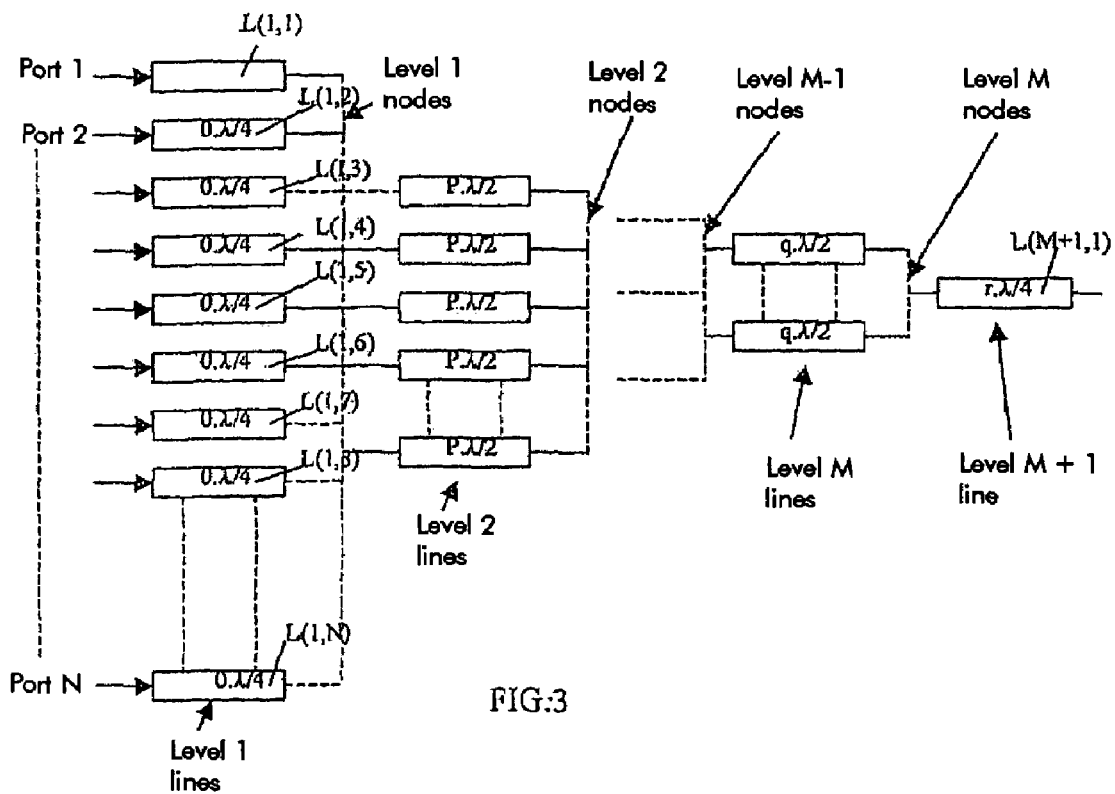
FIG:3

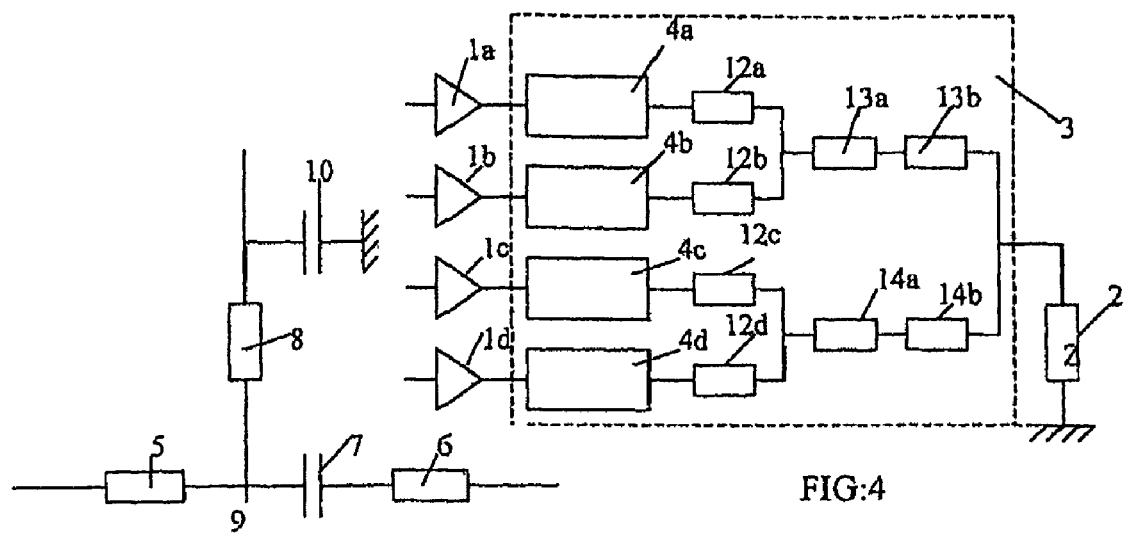
FIG:4
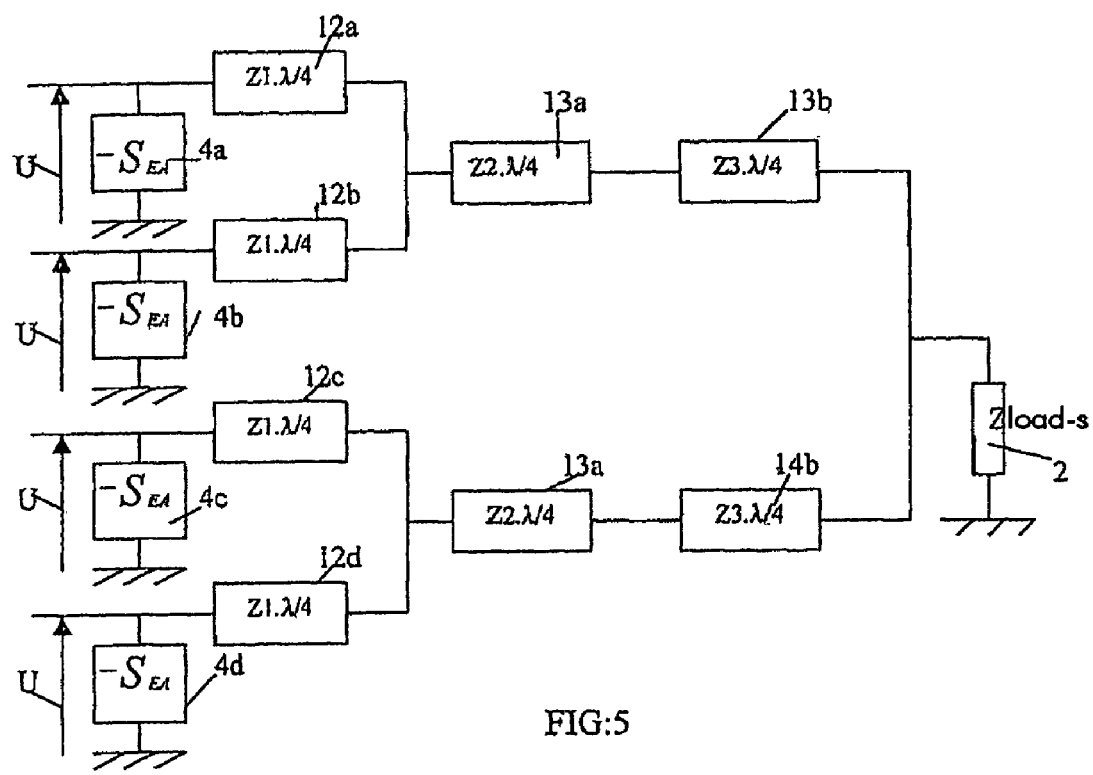
FIG: 2
FIG:5

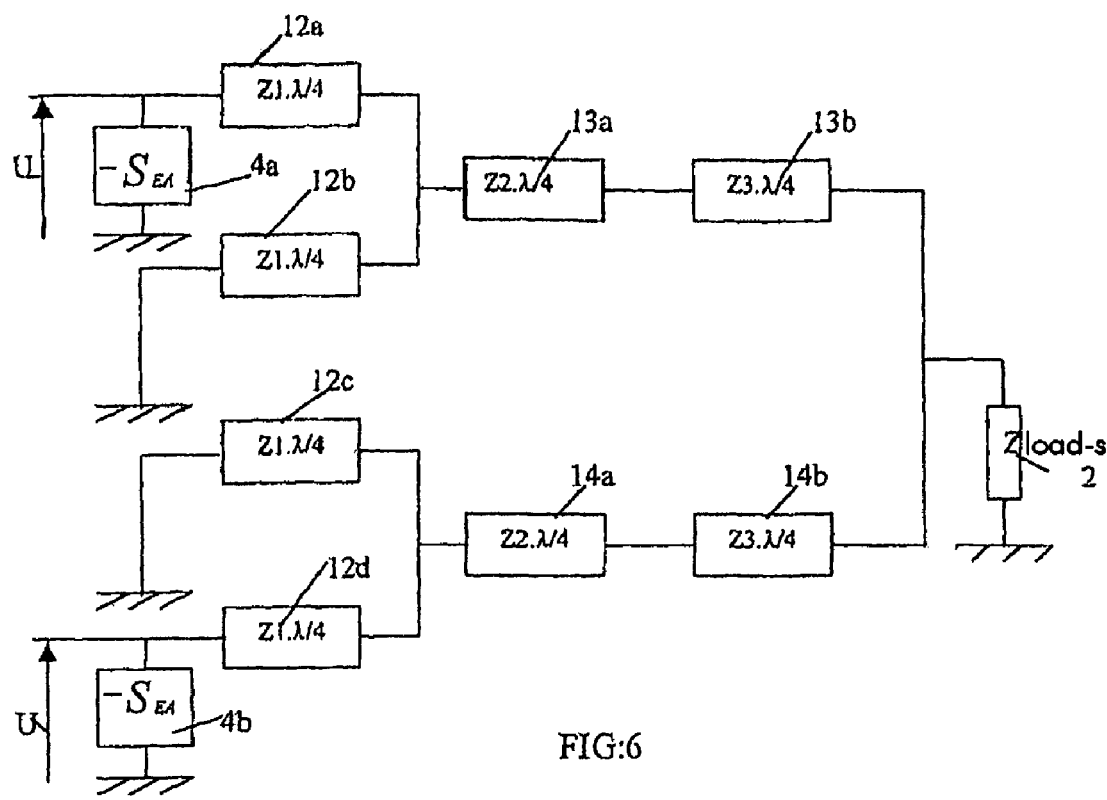
FIG:6
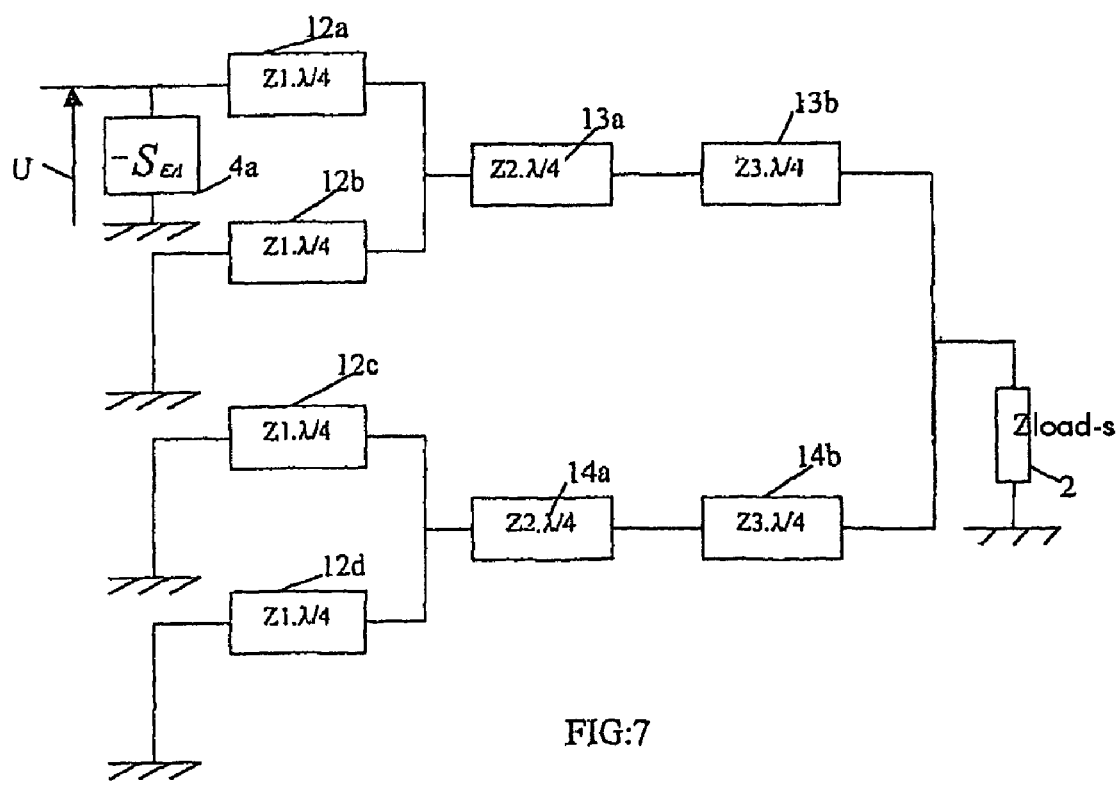
FIG:7

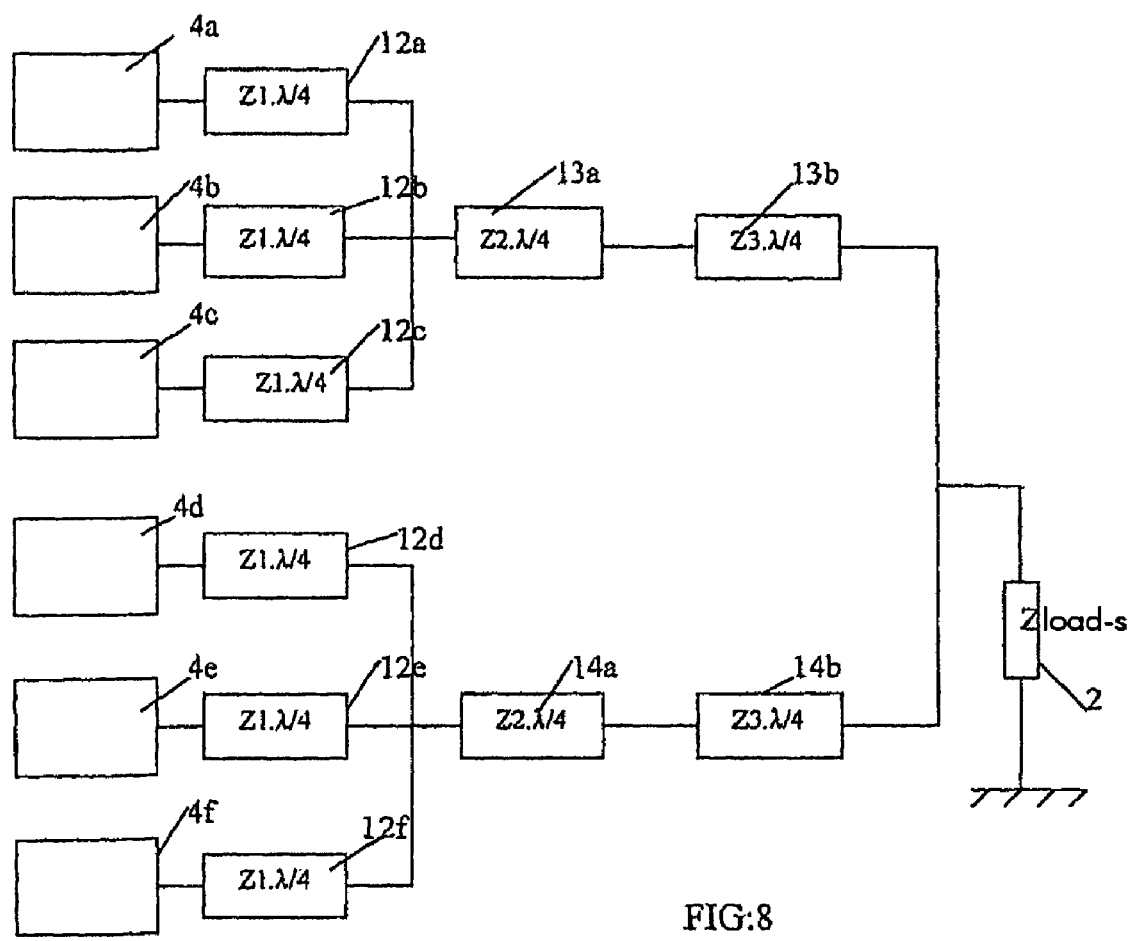
FIG:8

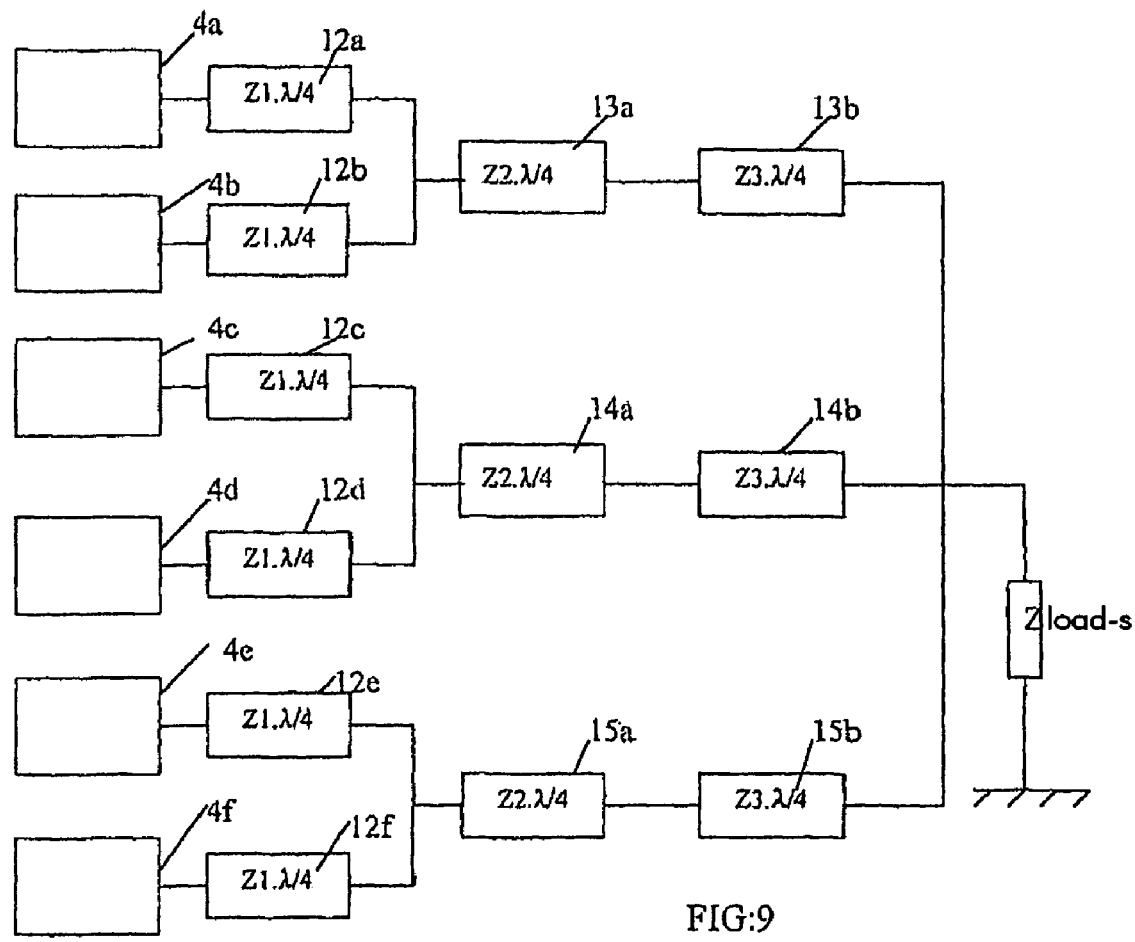
FIG:9

AMPLIFIER WITH HIGH OUTPUT POWER DYNAMIC

BACKGROUND OF THE INVENTION

The present invention relates to an amplifier that can be set to a high output power dynamic range and has a virtually constant added power efficiency.

It relates more particularly to producing a solid state power amplifier for microwave signals, in particular for satellite transmitters, adapted to operate in a frequency range close to 30 GHz, for example, and including a particular number of active components feeding a common load in parallel through an adapter consisting of a microcircuit made up of propagation lines, capacitors or inductors.

However, the invention relates equally to producing amplifier circuits with redundant amplifier stages in which the amplifiers are not necessarily power amplifiers.

Producing a solid state power amplifier using a two-state combiner employing microwave lines with an electrical length of $\lambda/4$, where $\lambda$ is the wavelength of the signal to be amplified, is known in the art. This circuit combines the signals supplied by four active components and provides as a result of the combination two output power levels with a constant added power ratio according to whether one active component is turned on or four active components are turned on.

This circuit has the drawback that it can provide only two power levels, a maximum output power level and an output power level 6 dB lower. Apart from this, the lack of symmetry of the circuit means that it is not possible for any active component to operate in isolation.

Another prior art embodiment known as a Doherty amplifier, differing from the above embodiment that is based on using the number of active components to implement power control, controls the dynamic range of the output power by varying the load conductances of the active components as a function of the input power.

This type of amplifier has the drawbacks of combining only two active components and of being ill-suited to applications requiring redundancy.

Obtaining an added power efficiency that is weakly dependent on the output power to adapt the bias points of the active components to the output power is also known in the art. This solution is difficult to put into practice, however, and the dynamic range of the output power is limited.

SUMMARY OF THE INVENTION

One object of the invention is to control the output power of a solid state amplifier by simultaneously controlling the number of active components turned on and the load conductances of the active components, without modifying the load susceptances of the active components whilst at the same time minimizing losses in the adapter.

To be more precise, the invention aims to produce an adapter capable of controlling effectively the values of the load conductances of the active components turned on by the percentage of active components turned off.

To achieve these objectives, the adapter of the output stage of the microwave amplifier of the invention comprises a particular number N of susceptance compensators respectively connected to the outputs of N active components to compensate the output susceptances of the active components and a circuit for combining and adapting the conductances having N inputs respectively connected to the outputs of the N susceptance compensators and an output connected to the load of the amplifier.

According to an embodiment that is the most general, the circuit for combining and adapting the load conductances of the active components comprises a particular number of line sections organized on M levels, level 1 being connected to the outputs of the N susceptance compensators via N respective line sections of equal electrical length that is an integer multiple of $\lambda/4$ and the level M is connected to the load of the amplifier either directly or indirectly via at least one line section of electrical length that is an integer multiple of $\lambda/4$ constituting an $(M+1)^{th}$ level. Each level, other than level 1 and level M+1, includes a particular number of line sections of equal electrical length that is an integer multiple of $\lambda/2$. In this configuration, the number of line sections of a level J is less than the number of line sections of the level J−1 that precedes it and each line section of a level may be connected to one or more line sections of the level that precedes it.

The electrical lengths of the line sections of the first level must be equal to an odd integer multiple of $\lambda/4$ if the impedance presented to the input of the combiner by an active component that is turned off combined with its susceptance compensator is a short circuit in order to present an open circuit to the level 1 nodes.

The electrical lengths of the line sections of the first level must be equal to an even integer multiple of $\lambda/4$ if the impedance presented to the input of the combiner by an active component that is turned off combined with its susceptance compensator is an open circuit in order to present an open circuit to the level 1 nodes.

To produce an impedance inverter transformer, the sum of the electrical lengths connecting an input of the combiner to its output must be equal to an odd integer multiple of $\lambda/4$.

To make the operation of the circuit symmetrical, each line section of a level is preferably connected to the same node of the same number of line sections of the level that precedes it.

In order to enhance the impedance transformer function of the adapter, the lines of electrical length that is an integer multiple of $\lambda/2$ connecting two nodes of different levels may be divided into a plurality of lines of electrical length $\lambda/4$ of different characteristic impedance.

In one particular embodiment of an amplifier of the invention the number of active components N=4 and the combiner and active component load conductance adapter is organized into two levels enabling a power dynamic range of 12 dB to be achieved between a configuration in which only one active component is turned on and a configuration in which the four active components are turned on.

Even wider power dynamic ranges may be obtained by increasing the number N of active components.

Moreover, each susceptance compensator is composed of two line sections connected in series via a capacitor between the output of the active component to which it is connected and the input of the combiner and conductance adapter that corresponds to it. The output susceptance of the active component is compensated by means of the two line sections and the capacitor and by means of a third line section connected between the common point between the capacitor and the line section connected to the output of the active component and one terminal of a capacitor of fixed capacitance connected by its second terminal to an earth point, the capacitor being biased by a bias voltage applied to its first terminal.

When an active component is turned off, varying the bias voltage applied to the capacitor varies the output impedance that this active component presents which leads to presenting a short circuit to the input of the combiner and adapter.

Choosing a different susceptance compensator topology presenting an open circuit to the input of the combiner and adapter when the active component is turned off may equally be envisaged.

The combiner may equally be implemented by a spatial power combination technique.

BRIEF DESCRIPTION OF THE DRAWINGS

Other features and advantages of the invention will become clearly apparent on reading the following description, which is given by way of example only and with reference to the appended drawings, in which:

FIG. 1 is a block diagram of one embodiment of a solid state microwave power amplifier of the invention.

FIG. 2 is a diagram of one embodiment of an output active component susceptance compensator of the FIG. 1 amplifier.

FIG. 3 is a block diagram showing one embodiment of the FIG. 1 combiner and load conductance adapter.

FIG. 4 shows one embodiment of an impedance adapter of an amplifier of the invention composed of four susceptance compensators.

FIGS. 5 to 7 illustrate the mode of operation of the FIG. 4 adapter.

FIGS. 8 and 9 show two embodiments of an impedance adapter of the invention including six susceptance compensators.

DETAILED DESCRIPTION OF THE INVENTION

Refer first to FIG. 1, which shows one embodiment of a solid state microwave power amplifier of the invention composed of N output active components 11 to 1N feeding in parallel a common load 2 via an adapter 3 for the output active components, represented inside a dashed line box.

The adapter 3 comprises a particular number N of susceptance compensators 41 to 4N respectively connected to outputs of N active components 11 to 1N to compensate the output susceptances of the active components and a circuit for combining and adapting the conductances 5 having N inputs respectively connected to the outputs of the N susceptance compensators and an output connected to the load 2 of the amplifier.

FIG. 2 shows that each susceptance compensator 41 to 4N is composed of two line sections 5 and 6 connected in series via a capacitor 7 between the output of an active component 11 to 1N to which it is connected and an input of the circuit 3 for combining and adapting the conductances that corresponds to it.

The output susceptance of the active component to which the compensator is connected is compensated by means of the two line sections and the capacitor and a third line section 8 connected between the common point 9 between the capacitor 7 and the line section 5 connected to the output of the active component and a first terminal of a capacitor 10 of fixed capacitance connected by its second terminal to a ground point 11, the capacitor 10 being biased by a bias voltage applied to its first terminal.

When an active component is turned off (by varying the bias voltage applied to the capacitor), the variation of the output impedance that this active component presents leads to presenting a short circuit to the input of the combiner and adapter.

Choosing a different susceptance compensator topology to present an open circuit to the input of the combiner and adapter when the active component is turned off may equally be envisaged.

The circuit 5 for combining and adapting the load conductances of the active components that is shown in FIG. 3 comprises a particular number of line sections organized on M levels.

Level 1 is connected to the outputs of the N susceptance compensators 41 to 4N via N respective line sections L(1,1) to L(1,N) of equal electrical length that is an integer multiple of $\lambda/4$ and the level M is connected to the load of the amplifier either directly or indirectly via at least one line section L(M+1,1) of electrical length that is an integer multiple of $\lambda/4$ constituting an $(M+1)^{th}$ level.

Each level other than level 1 and level M+1 includes a particular number of line sections of equal electrical length that is an integer multiple of $\lambda/2$.

In this configuration, each line section of a level may be connected to one or more line sections of the level that precedes it and the number of line sections of each level decreases as the number of levels from the first level increases, so that the number of line sections of a level J is always less than the number of line sections of the level J−1 that precedes it.

The electrical lengths of the line sections of the first level must be equal to an odd integer multiple of $\lambda/4$ if the impedance presented to the input of the combiner by a turned off active component combined with its susceptance compensator is a short circuit in order to present an open circuit to the nodes of level 1.

The electrical lengths of the line sections of the first level must be equal to an even integer multiple of $\lambda/4$ if the impedance presented to the input of the combiner by a turned off active component combined with its susceptance compensator is an open circuit in order to present an open circuit to the level 1 nodes.

To produce an impedance inverter transformer, the sum of the electrical lengths connecting an input of the combiner to its output must be equal to an odd integer multiple of $\lambda/4$.

To ensure symmetrical operation of the circuit, each line section of a level is preferably connected at the same node to the same number of line sections of the level that precedes it and the number N of line sections of the first level is even.

To enhance the impedance transformer function of the adapter, the lines of electrical length that is an integer multiple of $\lambda/2$ connecting two nodes of different levels may be divided into a plurality of lines of electrical length $\lambda/4$ of different characteristic impedance.

FIG. 4 shows an embodiment conforming to this principle of an adapter including four susceptance compensators 4a to 4d connected to the outputs of four active components 1a to 1d and two levels of line sections.

The first level is formed of four line sections 12a to 12d of characteristic impedance Z1 and of electrical length $\lambda/4$ respectively connected by one of their ends to the outputs of the susceptance compensators 4a to 4d.

The second level is formed of two line sections of electrical length $\lambda/2$ each composed of two half-line sections 13a, 13b and 14a, 14b of electrical length $\lambda/4$ connected in series, the two half-sections of a section having different characteristic impedances Z2 and Z3.

The connections between the first level and the second are effected by the second ends of the line sections 12a to 12d of electrical length $\lambda/4$ of the first level that are connected two by two to one end of the line sections 13a, 13b, on the one hand, and 14a, 14b, on the other hand, of electrical length $\lambda/2$ of the second level. The second ends of the sections of electrical length $\lambda/2$ 13a, 13b and 14a, 14b are connected together to the load 2 of the amplifier (impedance $Z_{load-s}$).

FIGS. 5 to 8 show the operation of the FIG. 4 adapter, in which elements homologous to those of FIG. 4 carry the same reference numbers.

In these figures, the compensators 4a to 4d are represented by their equivalent circuit which introduces a negative susceptance $-SEA$ that compensates the output susceptance of the active component.

What is represented in FIG. 5 corresponds to a configuration in which all the active components $1i$ of the amplifier are turned on, i.e. for which each of the active components $1i$ applies the same sinusoidal signal of amplitude U and of wavelength $\lambda$ to the input of a compensator $4i$.

In this configuration, the adapter acts as an impedance transformer, the load impedance Z (load 2) of the adapter relative to each of its inputs being defined by applying successively, to the path that connects it to the load impedance Z, the relations of transformation of impedance to the line sections in $\lambda/4$ encountered from that which is connected to the load Z of the adapter to that which is connected to the active component via the compensator.

As the powers supplied by the active components from $1a$ to $1d$ are equal, the power obtained at the output of the adapter is equal to four times that supplied by an active component.

The load impedances relative to each input of the adapter are equal and defined by the equation:

$$z = \frac{1}{4} \cdot \frac{z_1^2 \cdot z_3^2}{z_2^2 \cdot z_{LOAD-S}} \quad (1)$$

by setting:

$$z_c = \frac{z_1^2 \cdot z_3^2}{z_2^2 \cdot z_{LOAD-S}} \quad (2)$$

the load impedance Z relative to each active component is $$Z = \frac{z_c}{4} \quad (3)$$

Designating by U the amplitude of the voltage applied to each of the inputs of the compensators and assuming that the adapter has no losses, the output power Ps supplied to the load is:

$$Ps = 4 \cdot \left(\frac{1}{2} \cdot \frac{4 \cdot u^2}{z_c}\right) = \frac{8 \cdot u^2}{z_c} \quad (4)$$

What is represented in FIG. 6 corresponds to a configuration in which only two active components respectively feed the line sections of electrical length $\lambda/2$, 13a, 13b, on the one hand, and 14a, 14b, on the other hand.

In this case the line sections 12b, 12c of electrical length $\lambda/4$ being closed at one end by a short circuit, their other end is open circuit, which means that they can be disconnected from the rest of the circuit.

The two line sections of electrical length $\lambda/2$ of the second level, formed of the half-sections 13a, 13b, on the one hand, and 14a, 14b, on the other hand, are fed only by the active components 1a and 1d.

In this configuration the load impedance Z relative to each of the active components turned on is equal to:

$$z = \frac{z_c}{2} \quad (5)$$

The output power Ps supplied to the load is:

$$Ps = 2 \cdot \left(\frac{1}{2} \cdot \frac{2 \cdot u^2}{z_c}\right) = \frac{2 \cdot u^2}{z_c} \quad (6)$$

What is represented in FIG. 7 corresponds to a configuration in which only one active component $1a$ feeds the load via only one line section of electrical length $\lambda/2$ formed of the half-sections 13a and 13b.

In this case the line sections 12b, 12c and 12d of electrical length $\lambda/4$ being closed at one end by a short circuit, their other end is open circuit which means that they can be isolated from the rest of the circuit.

The line section of electrical length $\lambda/2$ of the second level formed of the half-sections 13a, 13b is fed by the active component 1a.

In this configuration the load impedance Z relative to the only active component turned on is:

$$Z = Z_c \quad (7)$$

The output power Ps supplied to the load is:

$$Ps = 1 \cdot \left(\frac{1}{2} \cdot \frac{u^2}{z_c}\right) = \frac{u^2}{2 \cdot z_c} \quad (8)$$

Equations (3), (5) show that the load conductance of the active components turned on reduces as the number of active components turned on decreases.

Also, assuming that the excitation level of the active components turned on is adjusted to obtain a constant output voltage U and that the adapter has no losses, equations (4), (6), (8) indicate at a glance a dynamic range of 12 dB of the output power Ps between the FIG. 5 configuration in which four active components are turned on and the FIG. 7 configuration in which only one active component is turned on. Thus the output power Ps is directly linked to the number of active components turned on.

It is equally apparent that the power level obtained for each configuration from a particular number of active components turned on is in all cases proportional to the square of the ratio between the characteristic impedances Z2 and Z3 of the line sections of the second level and is inversely proportional to the square of the characteristic impedance Z1 of the line section of the first level.

It is equally found that the load susceptance of the active components turned on is independent of the number of active components turned off. Accordingly, regardless of the mode of operation: with one or two or four active components in operation, and the load susceptance not varying, the added power efficiency remains constant.

The principle of producing an adapter of an amplifier including four active components can of course be extended to an amplifier including any number of active components enabling power dynamic ranges to be obtained that increase as the number of active components increases.

FIG. 8 represents one embodiment of an adapter of an amplifier including six active components respectively coupled to six susceptance compensators.

The FIG. 8 embodiment differs from that of FIG. 4 both in that it includes six susceptance compensators 4a to 4f and in that the outputs of the susceptance compensators (4a, 4b, 4c) and (4d, 4e, 4f) are connected three by three via a line section 12a to 12f of the first level respectively to one end of a line section 13a or 14a of the second level.

FIG. 9 shows a variant of the FIG. 8 adapter.

In this embodiment the outputs of the susceptance compensators 4a to 4f are connected two by two via a line section of the first level to a respective end of a line section of the second level that includes three line sections connected by their common second end to the load impedance of the adapter.

To implement the amplifier of the invention, the line sections constituting the combiner and adapter 5 may be produced by any microcircuit microwave technique known in the art.

The active components may be individual transistors or sets of transistors, for example cascode circuits.

The active components, the compensators and combiners may be integrated on the same monolithic circuit. However, for reasons of overall size and cost, the combiner may equally be separate from the active components and the susceptance compensators by a hybrid assembly.

The combiner may equally be produced by spatial power combination techniques provided that the action of reducing the percentage of active components turned on always leads to a decrease in the load conductance of the active components remaining turned on without impact on the load susceptances.

The invention claimed is:

1. Amplifier of microwave signals of wavelength $\lambda$ including a particular number N of active components coupled in parallel to a load impedance via an adapter (3), said adapter (3) comprising:
a particular number N of susceptance compensators (41 to 4N; 4a to 4d) respectively connected to the outputs of N active components (11 to 1N; 1a to 1d) to compensate the output susceptances of the active components (41 to 4N; 4a to 4d), and
a circuit for combining and adapting the conductances (5) having N inputs respectively connected to the outputs of the N susceptance compensators (41 to 4N; 4a to 4d) and an output connected to the load impedance (2) of the amplifier,
characterized in that
the circuit for combining and adapting the load conductances (5) of the active components comprises a particular number of line sections organized on M levels, where M is an integer greater than 1, level 1 being connected to the outputs of the N susceptance compensators (41 to 4N; 4a to 4d) via N respective line sections (L(1,1) to L(1,N) of equal electrical length that is an integer multiple of $\lambda/4$,
the level M is connected to the load of the amplifier and each level other than level 1 includes a particular number of line sections of equal electrical length that is an integer multiple of $\lambda/2$, and
each line section of a level other than level 1 is connected to one or more line sections of the level that precedes it and the number of line sections of each level decreases as the number of levels from the first level increases.

2. Amplifier according to claim 1, characterized in that the line sections of level M are connected to the load of the amplifier via at least one line section L(M+1, 1) of electrical length that is an integer multiple of $\lambda/4$ forming an $(M+1)^{th}$ level.

3. Amplifier according to either claim 1, characterized in that the line sections of electrical length that is an integer multiple of $\lambda/2$ are divided into a plurality of lines of electrical length $\lambda/4$ of different characteristic impedance.

4. Amplifier according to claim 1, characterized in that the electrical lengths of the line sections of the first level are equal to an odd integer multiple of $\lambda/4$ if the impedance presented to the input of the combiner by an active component turned off combined with its susceptance compensator is a short circuit in order to present an open circuit to the level 1 nodes.

5. Amplifier according to claim 1, characterized in that the electrical lengths of the line sections of the first level are equal to an even integer multiple of $\lambda/4$ if the impedance presented to the input of the combiner by an active component turned off combined with its susceptance compensator is an open circuit in order to present an open circuit to the level 1 nodes.

6. Amplifier according to claim 1, characterized in that the sum of the electrical lengths connecting an input of the combiner to its output is equal to an odd integer multiple of $\lambda/4$ in order to produce an impedance inverter transformer.

7. Amplifier according to claim 1, characterized in that each line section of a level other than level 1 is connected at the same node to the same number of line sections of the level that precedes it.

8. Amplifier according to claim 1, characterized in that the circuit for combining and adapting the load conductances (5) of the active components is organized in two levels to adapt the load of the amplifier to only four active components (1a, 1b, 1c, 1d), a first level composed of four line sections (12a, 12b, 12c, 12d) of electrical length $\lambda/4$ and a second level composed of two line sections (13a, 13b; 14a, 14b) of electrical length $\lambda/2$ connected by one of their common ends to the load impedance of the amplifier, the two line sections (13a, 13b; 14a, 14b) of electrical length $\lambda/2$ being divided into two line sections of electrical length $\lambda/4$ with different impedances Z2 and Z3.

9. Amplifier according to claim 1, characterized in that the circuit for combining and adapting the load conductances (5) of the active components is organized in two levels to adapt the load of the amplifier to only six active components (1a, 1b, 1c, 1d, 1e, 1f), a first level composed of six line sections (12a, . . . , 12f) of electrical length $\lambda/4$ and a second level composed of two line sections (13a, 13b; 14a, 14b) of electrical length $\lambda/2$ connected by one of their common ends to the load impedance (2) of the amplifier, the outputs of the susceptance compensators (4a, . . . , 4f) being connected three by three via a line section (12a, 12b, 12c; 12d, 12e, 12f) of the first level respectively to one end of a line section (13a, 13b; 14a, 14b) of the second level opposite that connected to the load impedance (2) of the amplifier, the two line sections (13a, 13b; 14a, 14b) of electrical length $\lambda/2$ being divided into two line sections of electrical length $\lambda/4$ with different impedances Z2 and Z3.

10. Amplifier according to claim 1, characterized in that the circuit for combining and adapting the load conductances (5) of the active components is organized in two levels to adapt the load (2) of the amplifier to only six active components (1a, 1b, 1c, 1d, 1e, 1f), a first level composed of six line sections (12a, . . . , 12f) of electrical length $\lambda/4$ and a second level composed of three line sections (13a, 13b; 14a, 14b; 15a, 15b) of electrical length $\lambda/2$ connected by one of their common ends to the load impedance (2) of the amplifier, the outputs of the susceptance compensators (4a, . . . , 4f) being connected two by two via a line section (12a, 12b; 12c, 12d;

12*e*, 12*f*) of the first level to a respective end of a line section (13*a*, 13*b*; 14*a*, 14*b*; 15*a*, 15*b*) of the second level opposite that connected to the load impedance (2) of the amplifier, the three line sections (13*a*, 13*b*; 14*a*, 14*b*; 15*a*, 15*b*) of electrical length $\lambda/2$ being each divided into two line sections of electrical length $\lambda/4$ with different impedances Z2 and Z3.

11. Amplifier according to claim 1, characterized in that each susceptance compensator (41 to 4N; 4*a* to 4*d*) is composed of two line sections (5, 6) connected in series via a capacitor (7) between the output of the active component (11 to 1N; 1*a* to 1*d*) to which it is connected and the corresponding input of the circuit for combining and adapting the conductances (5) and a third line section connected between, on the one hand, the common point (9) between the capacitor (7) and the line section (5) connected to the output of the active component (11 to 1N; 1*a* to 1*d*) and, on the other hand, one terminal of a capacitor (10) of fixed capacitance connected by its second terminal to an earth point of the circuit (11), the capacitor (10) of fixed capacitance being biased by a bias voltage applied to its first terminal that is determined as a function of the state of operation selected for the active component.

12. Amplifier according to claim 1, characterized in that the combiner is produced by a spatial power combination technique.

13. An amplifier according to claim 1, wherein M is an integer greater than 2.

* * * * *